US012672519B2

(12) United States Patent
Chen et al.

(10) Patent No.: US 12,672,519 B2
(45) Date of Patent: Jun. 30, 2026

(54) MECHANISM FOR FINE ADJUSTING AN ANGLE OF A SEMICONDUCTOR WAFER FIXTURE

(71) Applicant: CHENG MEI INSTRUMENT TECHNOLOGY CO., LTD., Zhubei City (TW)

(72) Inventors: Te-Chun Chen, Zhubei City (TW); Ming-Chih Cheng, Zhubei City (TW)

(73) Assignee: CHENG MEI INSTRUMENT TECHNOLOGY CO., LTD., Zhubei City (TW)

( * ) Notice: Subject to any disclaimer, the term of this patent is extended or adjusted under 35 U.S.C. 154(b) by 422 days.

(21) Appl. No.: 18/502,383

(22) Filed: Nov. 6, 2023

(65) Prior Publication Data

US 2025/0112084 A1 Apr. 3, 2025

(51) Int. Cl.
*H10P 72/76* (2026.01)
*H10P 72/78* (2026.01)

(52) U.S. Cl.
CPC ...... *H10P 72/7624* (2026.01); *H10P 72/7612* (2026.01); *H10P 72/78* (2026.01)

(58) Field of Classification Search
CPC .. H10P 72/7624; H10P 72/7612; H10P 72/78; H10P 72/7618; H10P 72/7626
See application file for complete search history.

(56) References Cited

U.S. PATENT DOCUMENTS

| | | | | |
|---|---|---|---|---|
| 6,413,156 B1 * | 7/2002 | Shimizu | ................. | B24B 37/26 |
| | | | | 451/287 |
| 9,953,806 B1 * | 4/2018 | Carson | ................ | H01J 37/3005 |
| 2010/0289283 A1 * | 11/2010 | Watanabe | ........... | H10P 72/0442 |
| | | | | 294/183 |

FOREIGN PATENT DOCUMENTS

KR 20210074189 A * 6/2021 ....... H01L 21/67259

* cited by examiner

*Primary Examiner* — Jason L Vaughan
*Assistant Examiner* — Amanda Kreiling
(74) *Attorney, Agent, or Firm* — HAUPTMAN HAM, LLP

(57) ABSTRACT

A mechanism for fine adjusting an angle of a semiconductor wafer fixture includes a fixture for a semiconductor wafer, a turntable, a rotating motor and a base. The top surface of the fixture is provided with a positioning portion for accommodating a semiconductor wafer, the turntable is detachably installed under the fixture, the rotating motor connects the bottom of the turntable and is installed on the base. An assembly for fine adjusting an angle of a semiconductor wafer fixture includes the above mechanism and several air bearings installed on the circumferential area of the base to support the turntable so as to fine adjust an angle of the turntable and the fixture.

40 Claims, 6 Drawing Sheets

MECHANISM FOR FINE ADJUSTING AN ANGLE OF A SEMICONDUCTOR WAFER FIXTURE

REFERENCE TO RELATED APPLICATIONS

This application claims priority to Taiwan Patent Application No. 112137527 filed on Sep. 28, 2023, which is incorporated herein by reference in its entirety.

BACKGROUND

Technical Field

The present invention relates to a mechanism for fine adjusting an angle of a semiconductor wafer fixture. More specifically, the present invention relates to a mechanism for fine adjusting the angle of a semiconductor wafer fixture that utilizes the levitation force of air bearings to achieve high-precision adjustment operations without errors. The present invention is particularly related to a mechanism and an assembly in which the semiconductor wafer fixture can be replaced with suitable ones to match different sizes of semiconductor wafers.

Descriptions of the Related Art

Traditional mechanisms normally install the semiconductor wafer fixture (also known as "suction cup") on the base below, and an ejector pin module including a number of ejector pins that can be raised and lowered is installed on a rotating motor. The semiconductor wafer fixture is provided with a number of guiding holes so that the ejector pins can pass through the guiding holes and protrude therefrom to lift the semiconductor wafer from the semiconductor wafer fixture.

Before conducting a semiconductor wafer test, an optical scanning instrument will be used to confirm whether the angle of the semiconductor wafer has any deviation. If there is a very small deviation in the angle of the semiconductor wafer, the liftable ejector pin module will be used first. The ejector pins lift the semiconductor wafer from the top surface of the semiconductor wafer fixture and are rotated by the rotating motor for fine adjustment. When the semiconductor wafer is rotated to a precise angle by the rotating motor and the ejector pins, the ejector pins are then lowered so that the semiconductor wafer can be positioned at the correct angle when it is placed to the semiconductor wafer fixture again.

However, the inherent characteristics of the rotating motor will cause subtle vibrations, which will cause the semiconductor wafer to generate slight deviations again when rotating. When the ejector pins are retracted and the semiconductor wafer is returned to the semiconductor wafer fixture, the shaking caused may further cause an error deviation of more than 0.002 degrees, making it impossible to perform a high-precision semiconductor wafer testing. In view of this, how to provide a mechanism for fine adjusting the angle of a semiconductor wafer fixture without producing angle errors is an urgent problem needed to be solved in the technical field the present invention belongs.

In addition, the existing mechanisms for fine adjusting an angle of a semiconductor wafer fixture always combine the semiconductor wafer fixture with the rotating motor and the base to form the mechanisms that are only suitable for measuring and adjusting the angle of semiconductor wafers with specific size. Semiconductor wafers, however, may have different sizes so that when it is necessary to measure and adjust the angles of semiconductor wafers of different sizes, the users must replace the entire set of the mechanisms and the semiconductor wafer fixture with specific size. Under such circumstance, more mechanisms or mechanical equipments need to be prepared to satisfy the requirements, and the replacement of different mechanisms or mechanical equipments for semiconductor wafers of different sizes will certainly cause a waste of operating hours in the measurement and adjustment process. Therefore, it is an urgent need to be solved in the technical field to which the present invention belongs.

SUMMARY

In order to solve at least the above-mentioned problems, the present invention provides a mechanism for fine adjusting an angle of a semiconductor wafer fixture. The mechanism includes: a semiconductor wafer fixture; a turntable detachably installed under the semiconductor wafer fixture; a rotating motor connects the bottom of the turntable; a base, wherein the rotating motor is installed on the base. The mechanism may also include a number of air bearings installed on the circumferential area of the base to support the turntable. When the air bearings are vacuumed (i.e., in a status of negative pressure), the bottom of the turntable is sucked and closely attached to the top of the air bearings. When the air bearings are in a status of positive pressure, they will perform an air flotation function so that the turntable is suspended above the air bearings with a tiny gap and thus the angles of the turntable and the semiconductor wafer fixture can be finely adjusted, and the semiconductor wafer fixture can also be disassembled from the turntable and replaced with another semiconductor wafer fixture of different sizes.

In order to solve at least the above-mentioned problems, the present invention provides a mechanism for fine adjusting an angle of a semiconductor wafer fixture. The mechanism includes: a semiconductor wafer fixture; an external turntable detachably installed under the semiconductor wafer fixture; an inner turntable attached to the bottom of the external turntable; a rotating motor connects the bottom of the inner turntable; a base, wherein the rotating motor is installed on the base. The mechanism further includes: a number of air bearings installed on the circumferential area of the base to support the external turntable; a number of protruding parts are provided at the bottom of the external turntable, and a number of recesses are provided at corresponding positions on the top surface of the inner turntable for accommodating the protruding parts. When the air bearings are vacuumed (i.e., in a status of negative pressure), the bottom of the external turntable is sucked and closely attached to the top of the air bearings. When the air bearings are in a status of positive pressure, they will perform an air flotation function so that the external turntable is suspended above the air bearings with a tiny gap and thus the angle of the external turntable and the semiconductor wafer fixture can be finely adjusted, and the semiconductor wafer fixture can also be disassembled from the external turntable and replaced with another semiconductor wafer fixture of different sizes.

In order to solve at least the above-mentioned problems, the present invention provides an assembly for fine adjusting an angle of a semiconductor wafer fixture. The assembly includes a mechanism for fine adjusting an angle of a semiconductor wafer fixture and a first air pressure control device; wherein each air bearing includes an air inlet and an air outlet, and the first air pressure control device is connected to the air inlet and the air outlet of the air bearing. When the first air pressure control device provides a negative pressure (i.e., in a status of vacuum), the bottom of the turntable is sucked and closely attached to the top of the air bearings. When the first air pressure control device provides a positive pressure to the air bearings, the air bearings will perform an air flotation function so that the turntable is suspended above the air bearings with a tiny gap and thus the angle of the semiconductor wafer fixture can be finely adjusted, and the semiconductor wafer fixture can also be disassembled from the turntable and replaced with another semiconductor wafer fixture of different sizes.

In order to solve at least the above-mentioned problems, the present invention provides an assembly for fine adjusting an angle of a semiconductor wafer fixture. The assembly includes a mechanism for fine adjusting an angle of a semiconductor wafer fixture and a first air pressure control device; wherein each air bearing includes an air inlet and an air outlet, and the first air pressure control device is connected to the air inlet and the air outlet of the air bearing. When the first air pressure control device provides a negative pressure (i.e., in a status of vacuum), the bottom of the external turntable is sucked and closely attached to the top of the air bearings. When the first air pressure control device provides positive pressure to the air bearings, the air bearings will perform an air flotation function so that the external turntable is suspended above the air bearings with a tiny gap and thus the angle of the semiconductor wafer fixture can be finely adjusted, and the semiconductor wafer fixture can also be disassembled from the external turntable and replaced with another semiconductor wafer fixture of different sizes.

As mentioned above, the present invention uses air bearings to suspend the semiconductor wafer fixture with a tiny gap so as to release the semiconductor wafer fixture away from the air bearings. The purpose to utilize the air flotation function performed by the air bearings is to slightly push the semiconductor wafer fixture upward thereby creating a tiny gap. Therefore, when the rotating motor rotates, the vibrations generated by its characteristics will be isolated by the tiny gap and will not be transmitted to the semiconductor wafer fixture. Because the vibration characteristics of the rotating motor have been isolated, the angle detection of the semiconductor wafer can be very precise without any error. Accordingly, the present invention can effectively solve the above-mentioned problems that traditional detection technologies can never overcome.

The present invention can be applicable to many semiconductor wafers, such as wafers or panels. Of course, the present invention can also be used for other semiconductor wafer products with similar properties.

The above contents are not intended to limit the present invention, but only briefly describe the technical problems that can be solved by the present invention so as to allow those with ordinary knowledge in the technical field to which the present invention belongs to correctly understand the present invention. Based on the attached drawings and the following contents, those with ordinary knowledge in the technical field to which the present invention belongs can further understand the various embodiments of the present invention.

BRIEF DESCRIPTION OF THE DRAWINGS

The drawings can assist the description of the present disclosure, wherein.

DETAILED DESCRIPTION

Figure 1:
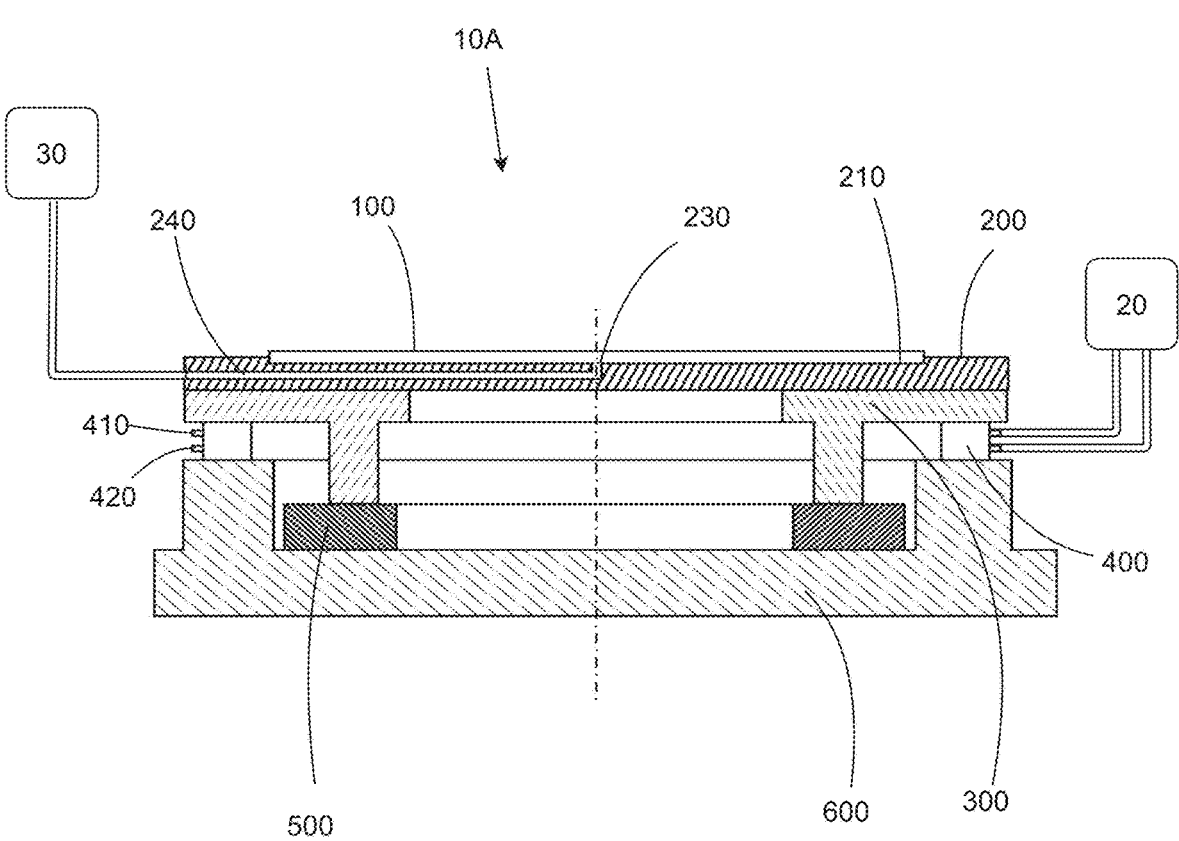
FIG. 1 is a schematic cross-sectional view of the mechanism for fine adjusting an angle of a semiconductor wafer fixture according to the first embodiment of the present invention and the assembly according to the third embodiment that includes said mechanism, the cross-sectional view shows that the turntable is closely attached to the top of the air bearings.

The technical contents of the present invention will be described through the following embodiments. These embodiments, however, are not intended to limit the present invention to only the described operations, environments, applications, structures, processes or steps. Those elements not directly related to the present invention are not explicitly shown in the drawings, but may be implicit in the drawings. In the drawings, the size of each element and the proportions between elements are only examples and are not used to limit the present invention. Unless otherwise specified, the same (or similar) element symbols in the descriptions denote the same (or similar) elements and the number of each element described below may be one or more unless otherwise specified.

The terms used in this disclosure are only used to describe the embodiments and are not intended to limit the invention. Unless the context clearly indicates otherwise, the terms such as "comprises" and "includes" indicate the presence of technical features, integers, steps, operations and/or elements and shall not exclude one or more other technical features, integers, steps, operations, components and/or combinations thereof. The term "and/or" includes any and all combinations of one or more of the related items.

Unless the context indicates otherwise, the purpose of using "first" or "second" before terms such as "mechanism", "air pressure control device", "assembly", etc. is only to distinguish between the two and should not be construed as sequential.

Figure 2:
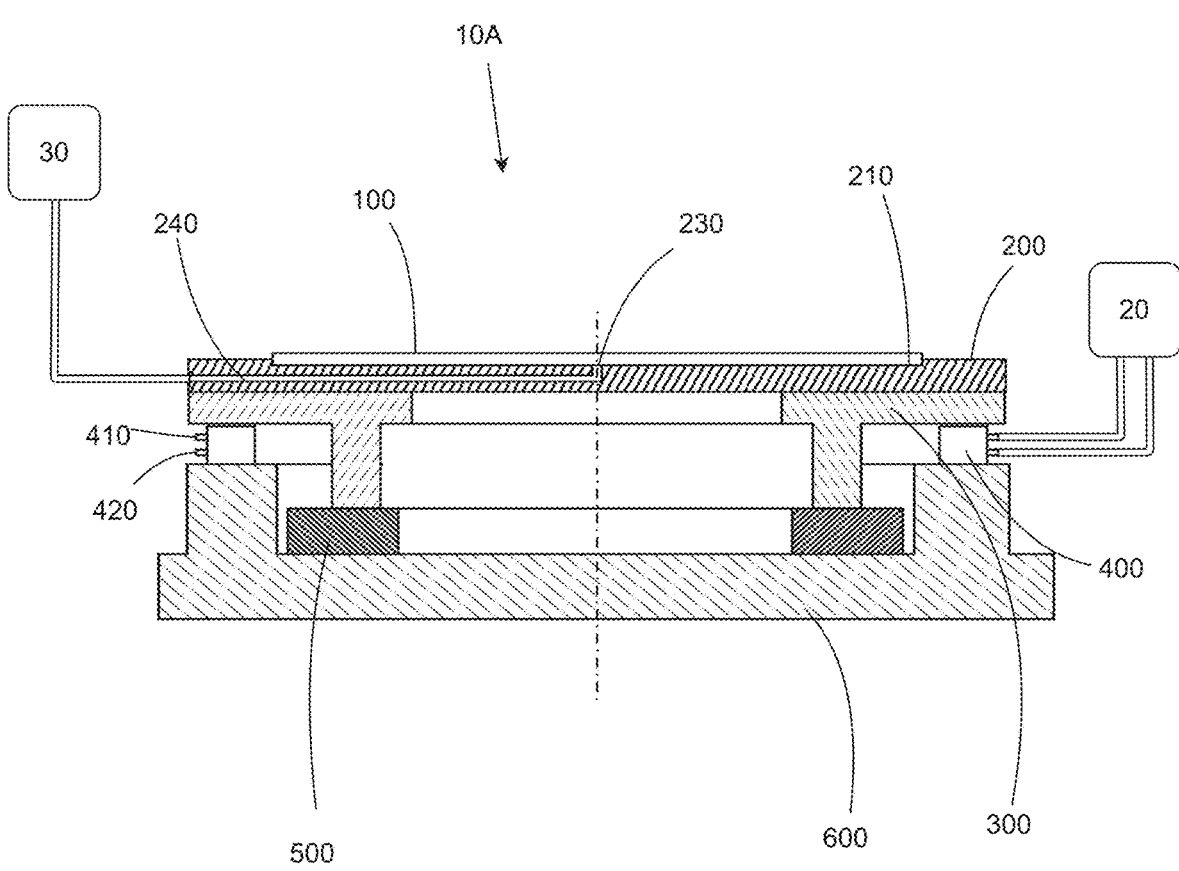
FIG. 2 is a schematic cross-sectional view of the mechanism for fine adjusting an angle of a semiconductor wafer fixture according to the first embodiment of the present invention and the assembly according to the third embodiment that includes said mechanism, the cross-sectional view shows that the turntable is suspended above the air bearings with a tiny gap.

As shown in FIG. 1 and FIG. 2, the mechanism 10A for fine adjusting an angle of a semiconductor wafer fixture according to the first embodiment of the present invention (hereinafter referred to as the mechanism 10A) includes a semiconductor wafer fixture 200, a turntable 300, a rotating motor 500, and a base 600.

The semiconductor wafer fixture 200 includes a positioning portion 210 on the top surface thereof for accommodating a semiconductor wafer 100, and at least one air hole 230 is provided within the range of the positioning portion 210. The semiconductor wafer fixture 200 is further provided with at least one air through hole 240, and the air hole 230 connects the outside of the semiconductor wafer fixture 200 through the air through hole 240.

The turntable 300 is detachably installed under the semiconductor wafer fixture 200. The rotating motor 500 connects the bottom of the turntable 300 and is installed on the base 600. The mechanism 10A further includes a number of air bearings 400 installed on the circumferential area of the base 600 to support the turntable 300. When the air bearings 400 are vacuumed (i.e., in a status of negative pressure), the bottom of the turntable 300 will be closely attached to the top of the air bearings 400 to prevent the semiconductor wafer fixture 200 from deflecting. When the air bearings 400 are in a status of positive pressure, they will perform an air flotation function so that the turntable 300 is suspended above the air bearings 400 with a tiny gap and thus the angles of the turntable 300 and the semiconductor wafer fixture 200 can be finely adjusted, and the semiconductor wafer fixture 200 can also be disassembled from the turntable 300 and replaced with another semiconductor wafer fixture of different sizes.

As shown in FIG. 2, when the air bearings 400 are in a status of positive pressure, they will perform an air flotation function between the air bearings 400 and the turntable 300. Further, there must be radial and axial clearance error due to the physical structural characteristics of the rotating motor 500 to generate a tiny air floating gap of about 5 microns (μm) between the turntable 300 and the air bearings 400. In other words, when the rotating motor 500 rotates, there is no friction between the turntable 300 and the air bearings 400 and thus high-precision adjustments can be performed to reduce the angle of adjusted measurement error to 0 degree.

Figure 3:
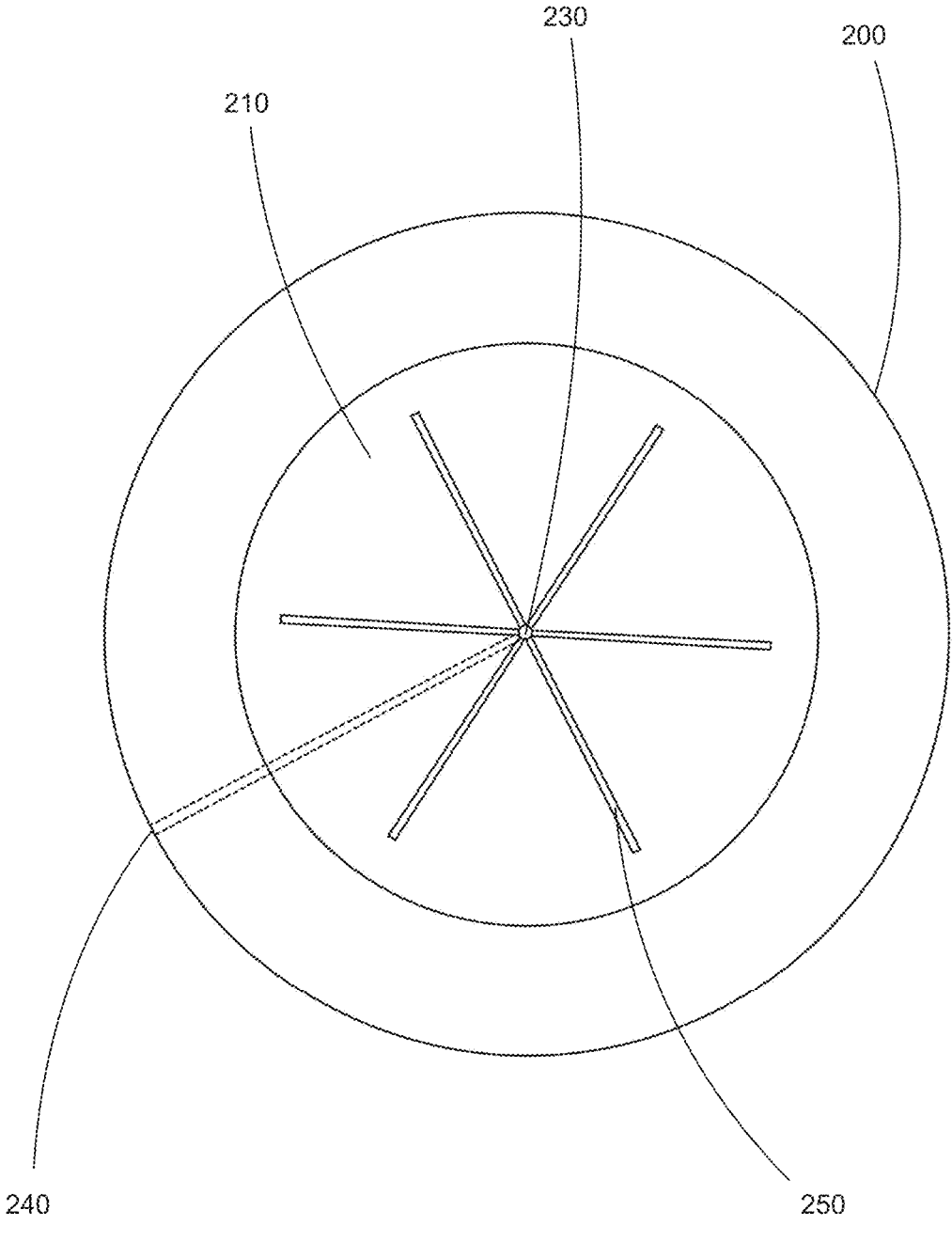
FIG. 3 is a top plan view of a semiconductor fixture according to an embodiment of the present invention.
Figure 4:
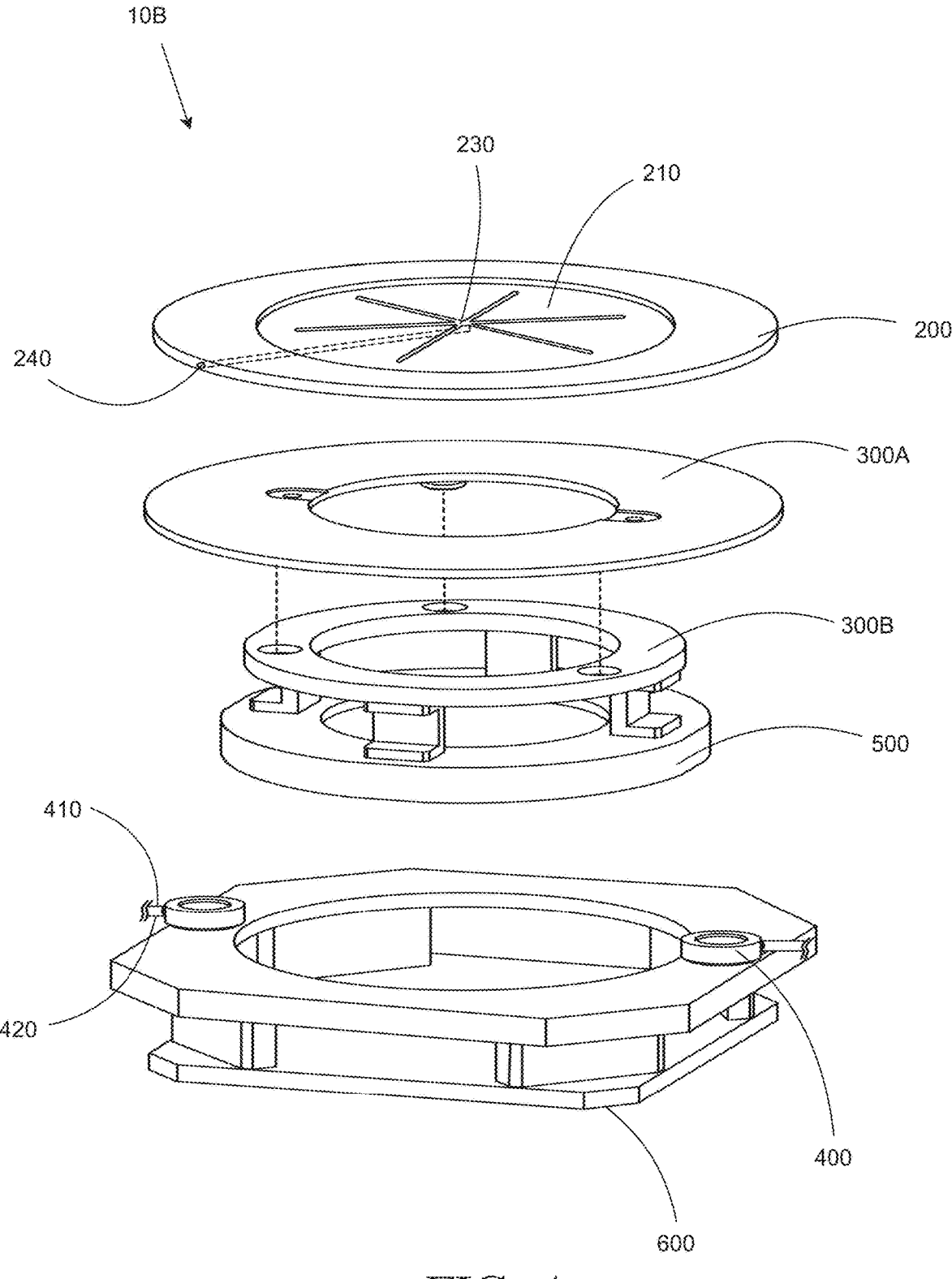
FIG. 4 is an exploded view of the mechanism for fine adjusting an angle of a semiconductor wafer fixture according to the present invention.

In some embodiments, as shown in FIG. 3, the positioning portion 210 can be a circular shallow groove to accommodate a circular semiconductor wafer. The positioning portion 210 can also be a quadrilateral shallow groove (not shown in the drawings) to accommodate a quadrilateral flat wafer. Of course, the positioning portion 210 can also be designed in other ways to limit the movement of the semiconductor wafer 100. In addition, the circular shallow groove or the quadrangular shallow groove is also provided with a plurality of dispersed grooves 250 connecting with the air holes 230 to enhance the average suction force of the semiconductor wafer 100.

In some embodiments, the number of the air bearings 400 can be selected as 6, 7, or 8 according to the size or weight of the semiconductor wafer fixture 200 and the turntable 300, but the air bearings 400 shall not be limited to such number and can be optimally adjusted to increase or decrease the number of the air bearings 400 according to actual needs.

In some embodiments, the semiconductor wafer fixture 200 and the turntable 300 can be made of steel or ceramics, and the bottom surface of the turntable 300 is preferably a flat and smooth surface. The bottom surface and/or surface of the turntable 300 can be polished to a highly smooth state to minimize friction and resistance, or even eliminate friction because of its metallic properties. Therefore, when the air bearings 400 are vacuumed (i.e., in a status of negative pressure), the adsorption force of the air bearings 400 to the bottom surface of the turntable 300 will be maximized. In addition, the turntable 300 made of ceramics can also be processed by surface polishing technology to achieve an optimized smooth surface. Therefore, ceramics can not only be used for semiconductor wafer fixtures but also be used as a better material for the turntable 300.

Figure 5:
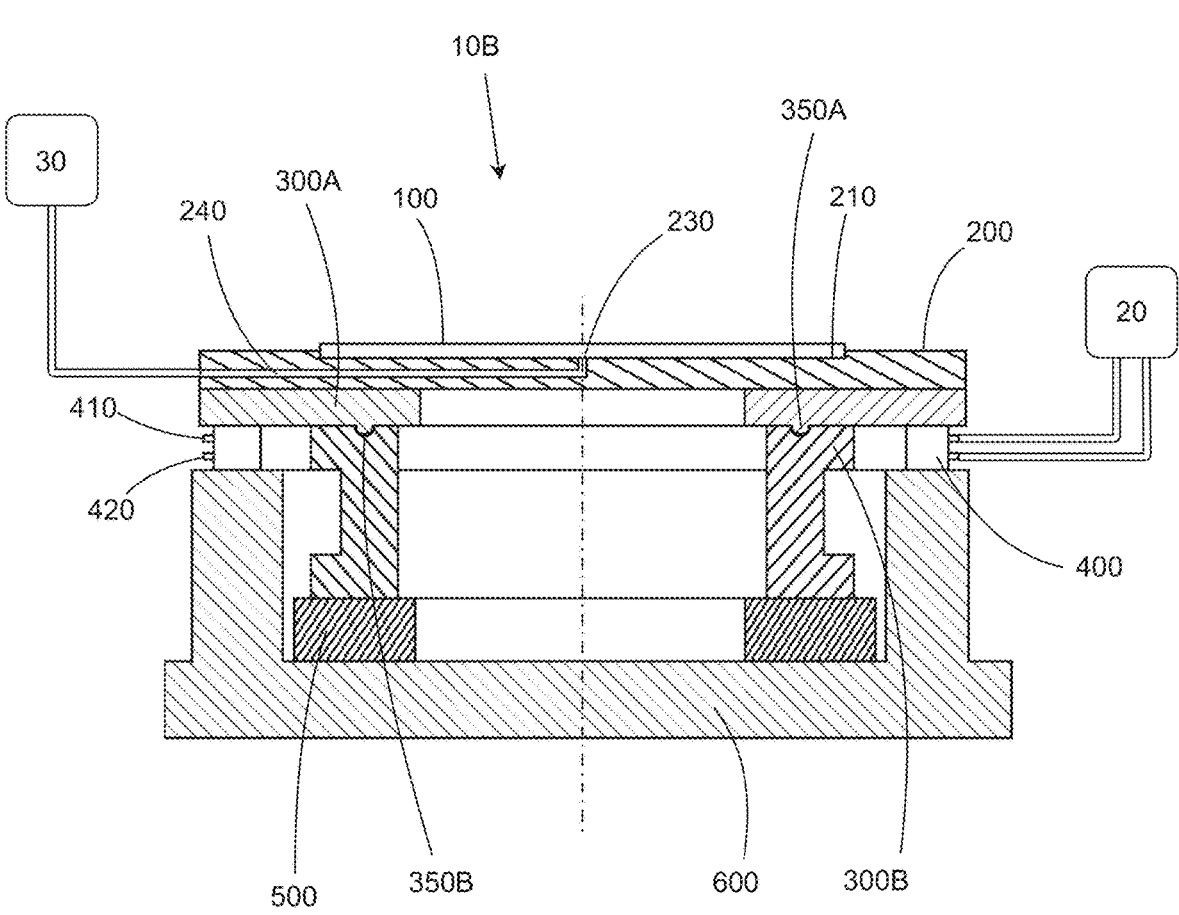
FIG. 5 is a schematic cross-sectional view of the mechanism for fine adjusting an angle of a semiconductor wafer fixture according to the second embodiment of the present invention and the assembly according to the fourth embodiment that includes said mechanism, the cross-sectional view shows that the external turntable is closely attached to the top of the air bearings.
Figure 6:
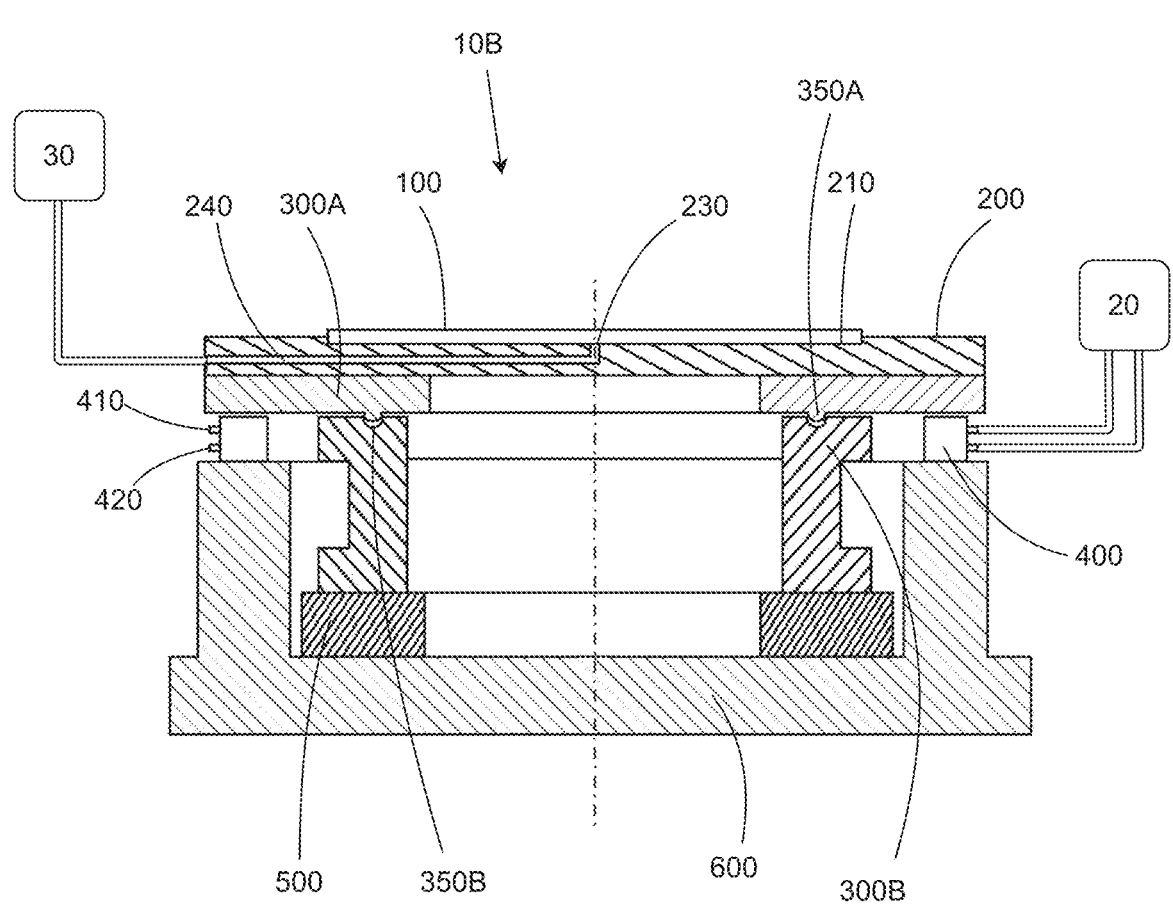
FIG. 6 is a schematic cross-sectional view of the mechanism for fine adjusting an angle of a semiconductor wafer fixture according to the second embodiment of the present invention and the assembly according to the fourth embodiment that includes said mechanism, the cross-sectional view shows that the external turntable is suspended above the air bearings with a tiny gap.

The mechanism 10A of the first embodiment or a mechanism 10B according to the second embodiment shown in FIG. 5 and FIG. 6 further include an ejector pin module (not shown in the drawings), which is located in the central area of the mechanism 10A or 10B and includes a number of ejector pins (not shown in the drawings). The semiconductor wafer fixture 200 is provided with a number of guide holes (not shown in the drawings) in corresponding numbers and positions for the ejector pins to push the semiconductor wafer 100 upwards away from the positioning portion 210 so as to replace the semiconductor wafer 100 to be detected with a new one. Moreover, the mechanism 10A or 10B may further include an ejector pin guide plate (not shown in the drawings) to constrain the vertical movement direction of the ejector pins. The disclosed ejector pin module, the ejector pins and the ejector pin guide plate are all existing technologies and thus will not be described in detail.

The rotating motor 500 is a direct drive motor (DD motor) that can directly drive the load. Since the direct drive motor eliminates the mechanical characteristics of conventional servo motors and the kinetic energy of rotation will not be transferred through a transmission device, such as a gearbox or a belt, the direct drive motor can achieve the purpose of high-precision and high-speed positioning and minimize vibration and errors. Since the rotating motor 500 can also be a thin hollow direct drive motor with a hollow design in the central area thereof, the ejector pin module can be arranged in such central hollow area. Moreover, other elements are allowed to pass through the central hollow area of the rotating motor so that the mechanism can be assembled easily and reduces its size.

In the following embodiments, the same technical effects can also be obtained by using the same materials and implementation methods based on the same principles mentioned above, and therefore will not be described again.

As shown in FIG. 5 and FIG. 6, the second embodiment of the present invention discloses the mechanism 10B for fine adjusting an angle of a semiconductor wafer fixture (hereinafter referred to as the mechanism 10B). The mechanism 10B includes a semiconductor wafer fixture 200, an external turntable 300A, an inner turntable 300B, a rotating motor 500, and a base 600.

The semiconductor wafer fixture 200 includes a positioning portion 210 on the top surface thereof for accommodating a semiconductor wafer 100, and at least one air hole 230 is provided within the range of the positioning portion 210. The semiconductor wafer fixture 200 is further provided with at least one air through hole 240, and the air hole 230 connects the outside of the semiconductor wafer fixture 200 through the air through hole 240.

The external turntable 300A is detachably installed under the semiconductor wafer fixture 200. Therefore, the semiconductor wafer fixture 200 of this embodiment can be easily replaced with other semiconductor wafer fixture of different sizes according to the user's needs. The inner turntable 300B is attached to the bottom of the external turntable 300A, and the rotating motor 500 connects the bottom of the inner turntable 300B and is installed on the base 600.

The mechanism 10B further includes a number of air bearings 400 installed on the circumferential area of the base 600 to support the inner turntable 300B. A number of protruding parts 350A are provided at the bottom of the external turntable 300A, and a number of recesses 350B are provided at corresponding positions on the top surface of the inner turntable 300B for accommodating the protruding parts 350A. When the air bearings 400 are vacuumed (i.e., in a status of negative pressure), the protruding parts 350A of the external turntable 300A are inserted into the recesses 350B of the inner turntable 300B, and the external turntable 300A is closely attached to the top of the air bearings 400 so as to prevent the semiconductor wafer fixture 200 from deflecting. When the air bearings 400 are in a status of positive pressure, they will perform an air flotation or levitation function so that the external turntable 300A is suspended above the air bearings 400 and the inner turntable 300B with a tiny gap and thus the angles of the external turntable 300A and the semiconductor wafer fixture 200 can be finely adjusted, and the semiconductor wafer fixture 200 can also be disassembled from the external turntable 300A and replaced with another semiconductor wafer fixture of different sizes.

Further, as shown in FIG. 6, when the air bearings 400 operate at a positive pressure and blow out air thrust to the external turntable 300A, the external turntable 300A is suspended above the air bearings 400 with a tiny gap as described in the previous paragraph, and the protruding parts 350A of the external turntable 300A will float upward from the recesses 350B of the inner turntable 300B by the same tiny gap so that the vibration incurred and transmitted by the characteristics of the rotating motor 500 can be effectively isolated by the tiny gap, and the vibration will not be transmitted to the external turntable 300A and the semiconductor wafer fixture 200.

The mechanism 10B further includes a number of shock-absorbing elements (not shown in the drawings), which can be placed on each of the protruding parts 350A. When the external turntable 300A is closely attached to the top of the air bearings 400, each of the shock-absorbing elements can absorb the vibration transmitted upward by the rotating motor 500. In other words, when the air bearings 400 are in a status of positive pressure, the tiny gap resulted from the levitation force generated by the positive pressure of the air bearings 400 between the external turntable 300A and the inner turntable 300B can effectively isolate the vibration incurred and transmitted by the characteristics of the rotating motor 500. However, when the air bearings 400 are vacuumed (i.e., in a status of negative pressure) and the external turntable 300A is closely attached to the top of the air bearings 400, the shock-absorbing elements will absorb the slight vibrations generated by the rotating motor 500.

Furthermore, FIG. 1 and FIG. 2 also illustrate a third embodiment of the present invention. The mechanism 10A can also cooperate with other components to form an assembly 1 for fine adjusting an angle of a semiconductor wafer fixture (hereinafter referred to as the assembly 1). The assembly 1 includes a first air pressure control device 20, and each of the air bearings 400 includes an air inlet 410 and an air outlet 420. The first air pressure control device 20 is connected to the air inlet 410 and the air outlet of the air bearing 400. When the first air pressure control device 20 provides a vacuum function with negative pressure, the turntable 300 is closely attached to the top of the air bearings 400 so as to prevent the semiconductor wafer fixture 200 from deflecting. When the first air pressure control device 20 provides a positive air pressure to the air bearings 400, the air bearings 400 will perform an air flotation function so that the turntable 300 is suspended above the air bearings 400 with a tiny gap and thus the angles of the semiconductor wafer fixture 200 can be finely adjusted, and the semiconductor wafer fixture 200 can be disassembled from the turntable 300 and replaced with another semiconductor wafer fixture of different sizes.

In addition, the assembly 1 further includes at least a second air pressure control device 30 to connect to the air through hole 240. When the second air pressure control device 30 provides a vacuum function with negative pressure, the semiconductor wafer 100 is absorbed to the positioning portion 210 of the semiconductor wafer fixture 200. When the second air pressure control device 30 releases the negative pressure of vacuum or provides positive pressure, the semiconductor wafer 100 is released from the positioning portion 210 of the semiconductor wafer fixture 200.

FIG. 5 and FIG. 6 illustrate the fourth embodiment of the present invention. The mechanism 10B can also cooperate with other components to form an assembly 2 for fine adjusting an angle of a semiconductor wafer fixture (hereinafter referred to as the assembly 2). The assembly 2 includes a first air pressure control device 20, and each of the air bearings 400 includes an air inlet 410 and an air outlet 420. The first air pressure control device 20 is connected to the air inlet 410 and the air outlet 420 of the air bearings 400. When the first air pressure control device 20 provides a vacuum function with negative pressure, the external turntable 300A is closely attached to the top of the air bearings 400 so as to prevent the semiconductor wafer fixture 200 from deflecting. When the first air pressure control device 20 provides a positive air pressure to the air bearings 400, the air bearings 400 will perform an air flotation function so that the external turntable 300A is suspended above the air bearings 400 with a tiny gap and thus the angles of the semiconductor wafer fixture 200 can be finely adjusted, and the semiconductor wafer fixture 200 can be disassembled from the external turntable 300A and replaced with another semiconductor wafer fixture of different sizes. Furthermore, the assembly 2 can also use a second air pressure device 30 to connect to the air through hole 240 of the semiconductor wafer fixture 200 based on the same principle as mentioned above, so as to exert the function of absorbing or releasing the semiconductor wafer 100, which will not be described again here.

The above embodiments are only examples to illustrate the present invention and are not intended to limit the scope of the present invention. Any other embodiments resulting from the modification, change, adjustment, and integration of the above embodiments, as long as it is not difficult for a person with ordinary knowledge in the technical field to which the present invention belongs to conceive, are covered by the protection scope of the present invention. The scope of protection for the present invention shall be determined by the affiliated claims.

What is claimed is:

1. A mechanism for fine adjusting an angle of a semiconductor wafer fixture comprising:

a semiconductor wafer fixture including a positioning portion on the top surface thereof for accommodating a semiconductor wafer, at least one air hole within the range of the positioning portion, and at least one air through hole for connecting the air hole and outside of the semiconductor wafer fixture;

a turntable detachably installed under the semiconductor wafer fixture;

a rotating motor connecting the bottom of the turntable;

a base, the rotating motor being installed on the base; and a number of air bearings, wherein the air bearings are installed on the circumferential area of the base to support the turntable; when the air bearings are in a status of negative pressure, the turntable is closely attached to the top of the air bearings, and when the air bearings are in a status of positive pressure, the turntable is suspended above the air bearings with a tiny gap so that the angle of the turntable and the semiconductor wafer fixture can be finely adjusted.

2. The mechanism according to claim 1, wherein the positioning portion is a circular shallow groove or a quadrilateral shallow groove.

3. The mechanism according to claim 2, wherein the shallow groove is provided with a plurality of dispersed grooves connecting with the air hole to enhance the average suction force to the semiconductor wafer.

4. The mechanism according to claim 1, wherein the number of the air bearings is 6 to 8.

5. The mechanism according to claim 1, wherein the semiconductor wafer fixture and the turntable are made of steel or ceramics.

6. The mechanism according to claim 5, wherein the bottom surface of the turntable is a flat and smooth surface.

7. The mechanism according to claim 1, wherein the rotating motor is a direct drive motor.

8. The mechanism according to claim 7, further comprising an ejector pin module located in a central area of the mechanism and including a number of ejector pins, and a number of guide holes provided on the semiconductor wafer fixture in corresponding numbers and positions for the ejector pins to push the semiconductor wafer upwards away from the positioning portion.

9. The mechanism according to claim 8, further comprising an ejector pin guide plate to constrain the vertical movement direction of the ejector pins.

10. An assembly for fine adjusting an angle of a semiconductor wafer fixture comprising:

a mechanism for fine adjusting an angle of a semiconductor wafer fixture according to claim 1; and a first air pressure control device, wherein each said air bearing includes an air inlet and an air outlet, the first air pressure control device is connected to the air inlet and the air outlet of the air bearings, when the first air pressure control device provides a vacuum function with negative pressure, the turntable is closely attached to the top of the air bearings, when the first air pressure control device provides a positive air pressure to the air bearings, the turntable is suspended above the air bearings with a tiny gap and thus the angles of the semiconductor wafer fixture can be finely adjusted.

11. The assembly according to claim 10, wherein the positioning portion is a circular shallow groove or a quadrilateral shallow groove.

12. The assembly according to claim 11, wherein the shallow groove is provided with a plurality of dispersed grooves connecting with the air hole to enhance the average suction force to the semiconductor wafer.

13. The assembly according to claim 10, wherein the number of the air bearings is 6 to 8.

14. The assembly according to claim 10, wherein the fixture and the turntable are made of steel or ceramics.

15. The assembly according to claim 14, wherein the bottom surface of the turntable is a flat and smooth surface.

16. The assembly according to claim 10, wherein the rotating motor is a direct drive motor.

17. The assembly according to claim 16, further comprising an ejector pin module located in a central area of the mechanism and including a number of ejector pins, and a number of guide holes provided on the semiconductor wafer fixture in corresponding numbers and positions for the ejector pins to push the semiconductor wafer upwards away from the positioning portion.

18. The assembly according to claim 17, further comprising an ejector pin guide plate to constrain the vertical movement direction of the ejector pins.

19. The assembly according to claim 10, further comprising a second air pressure control device connecting the air through hole of the semiconductor wafer fixture, when the second air pressure control device provides a vacuum function with negative pressure, the semiconductor wafer is absorbed to the positioning portion of the semiconductor wafer fixture, and when the second air pressure control device releases the negative pressure or provides a positive pressure, the semiconductor wafer is released from the positioning portion of the semiconductor wafer fixture.

20. The assembly according to claim 10, wherein the fixture and the external turntable are made of steel or ceramics.

21. The assembly according to claim 20, wherein the bottom surface of the external turntable is a flat and smooth surface.

22. A mechanism for fine adjusting an angle of a semiconductor wafer fixture comprising:

a semiconductor wafer fixture including a positioning portion on the top surface thereof for accommodating a semiconductor wafer, at least one air hole within the range of the positioning portion, and at least one air through hole for connecting the air hole and outside of the semiconductor wafer fixture;

an external turntable detachably installed under the semiconductor wafer fixture;

an inner turntable attached to the bottom of the external turntable;

a rotating motor connecting the bottom of the inner turntable;

a base, the rotating motor being installed on the base; and a number of air bearings, wherein the air bearings are installed on the circumferential area of the base to support the external turntable; the external turntable includes a number of protruding parts at the bottom thereof, and the inner turntable is provided with a number of recesses at corresponding positions on the top surface of the inner turntable for accommodating the protruding parts; when the air bearings are in a status of negative pressure, the external turntable is closely attached to the top of the air bearings, and when the air bearings are in a status of positive pressure, the external turntable is suspended above the air bearings with a tiny gap so that the angle of the external turntable and the semiconductor wafer fixture can be finely adjusted.

23. The mechanism according to claim 22, wherein the positioning portion is a circular shallow groove or a quadrilateral shallow groove.

24. The mechanism according to claim 23, wherein the shallow groove is provided with a plurality of dispersed grooves connecting with the air hole to enhance the average suction force to the semiconductor wafer.

25. The mechanism according to claim 22, wherein the number of the air bearings is 6 to 8.

26. The mechanism according to claim 22, wherein the fixture and the external turntable are made of steel or ceramics.

27. The mechanism according to claim 26, wherein the bottom surface of the external turntable is a flat and smooth surface.

28. The mechanism according to claim 22, wherein the rotating motor is a direct drive motor.

29. The mechanism according to claim 28, further comprising an ejector pin module located in a central area of the mechanism and including a number of ejector pins, and a number of guide holes provided on the semiconductor wafer fixture in corresponding numbers and positions for the ejector pins to push the semiconductor wafer upwards away from the positioning portion.

30. The mechanism according to claim 29, further comprising an ejector pin guide plate to constrain the vertical movement direction of the ejector pins.

31. The mechanism according to claim 22, further comprising a number of shock-absorbing elements, wherein each of the shock-absorbing elements is placed on each of the corresponding protruding parts to absorb the vibrations generated by the rotating motor.

32. An assembly for fine adjusting an angle of a semiconductor wafer fixture comprising:

a mechanism for fine adjusting an angle of a semiconductor wafer fixture according to claim 22; and a first air pressure control device, wherein each said air bearing includes an air inlet and an air outlet, the first air pressure control device is connected to the air inlet and the air outlet of the air bearings, when the first air pressure control device provides a vacuum function with negative pressure, the external turntable is closely attached to the top of the air bearings, when the first air pressure control device provides a positive air pressure to the air bearings, the external turntable is suspended above the air bearings with a tiny gap and thus the angles of the semiconductor wafer fixture can be finely adjusted.

33. The assembly according to claim 32, wherein the positioning portion is a circular shallow groove or a quadrilateral shallow groove.

34. The assembly according to claim 33, wherein the shallow groove is provided with a plurality of dispersed grooves connecting with the air hole to enhance the average suction force to the semiconductor wafer.

35. The assembly according to claim 32, wherein the number of the air bearings is 6 to 8.

36. The assembly according to claim 32, wherein the rotating motor is a direct drive motor.

37. The assembly according to claim 36, further comprising an ejector pin module located in a central area of the mechanism and including a number of ejector pins, and a number of guide holes provided on the semiconductor wafer fixture in corresponding numbers and positions for the ejector pins to push the semiconductor wafer upwards away from the positioning portion.

38. The assembly according to claim 37, further comprising an ejector pin guide plate to constrain the vertical movement direction of the ejector pins.

39. The assembly according to claim 32, further comprising a number of shock-absorbing elements, wherein each of the shock-absorbing elements is placed on each of the corresponding protruding parts to absorb the vibrations generated by the rotating motor.

40. The assembly according to claim 32, further comprising a second air pressure control device connecting the air through hole of the semiconductor wafer fixture, when the second air pressure control device provides a vacuum function with negative pressure, the semiconductor wafer is absorbed to the positioning portion of the semiconductor wafer fixture, and when the second air pressure control device releases the negative pressure or provides a positive pressure, the semiconductor wafer is released from the positioning portion of the semiconductor wafer fixture.

* * * * *